United States Patent [19]
Kane

[11] Patent Number: 5,060,110
[45] Date of Patent: Oct. 22, 1991

[54] HIGH FREQUENCY MOSCAP

[75] Inventor: Robert C. Kane, Woodstock, Ill.

[73] Assignee: Motorola, Inc., Schaumburg, Ill.

[21] Appl. No.: 575,106

[22] Filed: Aug. 29, 1990

[51] Int. Cl.⁵ .................. H01G 4/06; H01G 7/00; H01L 21/28; H01L 27/02
[52] U.S. Cl. .................. 361/311; 29/25.42; 437/41; 357/51
[58] Field of Search ............ 29/25.42; 361/311, 312, 361/313; 357/16, 22, 23.12, 51, 54; 437/41, 44, 53

[56] References Cited
U.S. PATENT DOCUMENTS

| 4,088,799 | 5/1978 | Kurtin | 427/38 |
| 4,923,823 | 5/1990 | Kohno | 437/41 |
| 4,956,698 | 9/1990 | Wang | 357/16 X |
| 4,958,204 | 9/1990 | Blanchard et al. | 357/22 |

Primary Examiner—Donald A. Griffin
Attorney, Agent, or Firm—Steven G. Parmelee

[57] ABSTRACT

A MOSCAP that includes a semiconductor layer (103) having gold impurities sufficient to increase the density of deep recombination traps in the semiconductor bandgap. During operation of the MOSCAP in high frequency, reverse bias operating conditions, these deep recombination traps will facilitate formation of an inversion layer that will maintain relatively stable capacitive characteristics for the resultant MOSCAP.

9 Claims, 1 Drawing Sheet

HIGH FREQUENCY MOSCAP

TECHNICAL FIELD

This invention relates generally to metal oxide semiconductor-technology, and more particularly to capacitors formed through use of such methodology.

BACKGROUND OF THE INVENTION

Prior art Metal Oxide Semiconductor Capacitors (MOSCAPs) are formed by depositing a layer of metallic conductor material onto a layer of oxide that has itself been deposited or grown on a layer of semiconductor material. MOSCAPs are often used to provide impedance matching functions in transistor device packages.

In certain applications, particularly when used with high frequency power transistors where high VSWR frequently occurs, reverse bias operation can result. This mode of operation drives the MOSCAP into a deep depletion mode. Whereas in low frequency operation reverse bias operation will typically result in the formation of an inversion layer that serves to limit the depletion layer thickness, high frequency operation causes the depletion region to not stabilize in an inversion layer because of long carrier lifetimes in the semiconductor. As a result, an unacceptably deep depletion region can form, or alternatively, avalanche breakdown can result. As a result of the above, the MOSCAP itself may self destruct and/or cause the associated transistor to become permanently nonfunctional.

Accordingly, there exists a need for a MOSCAP that will function normally during high frequency, reverse bias operating conditions.

SUMMARY OF THE INVENTION

This need and others are substantially met through provision of the capacitor disclosed herein. The capacitor includes a semiconductor layer formed of material having a characteristic bandgap. Pursuant to this invention, the semiconductor layer includes at least one preselected impurity, which impurity has an energy level corresponding to an energy residing near the middle of the bandgap. So configured, the capacitor will exhibit a substantially stable capacitance when used in a high frequency application.

In one embodiment, the impurity may be comprised of gold. In another embodiment, the impurity may have a density within the semiconductor layer on the order of at least one times ten to the fourteenth atoms/centimeter squared.

In one embodiment of the invention, this impurity is present within the semiconductor layer in a quantity sufficient to support formation of an inversion layer in the semiconductor layer when the capacitor operates during reverse bias/high frequency operating conditions.

DETAILED DESCRIPTION OF A PREFERRED EMBODIMENT

Figure 1:
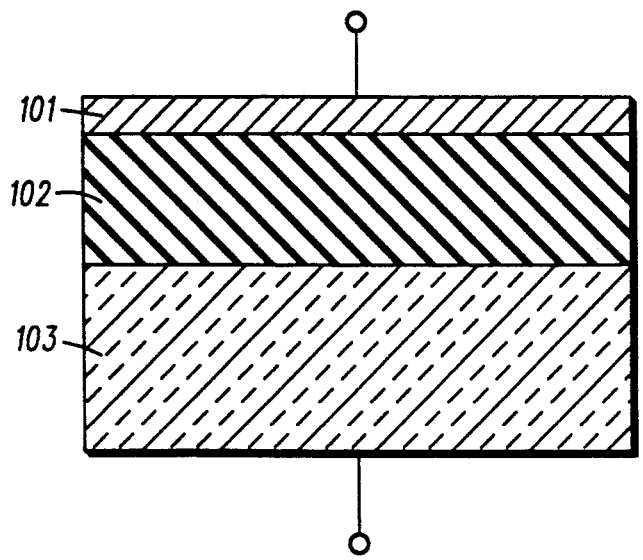
FIG. 1 comprises a section side elevational view of a capacitor configured in accordance with the invention.

A MOSCAP configured in accordance with the invention can be seen as generally depicted in FIG. 1. A substrate semiconductor layer (103) which may be comprised of silicon or other appropriate semiconductor material, is doped with impurities. In this particular embodiment, the impurity comprises gold. Gold constitutes an appropriate impurity for this application because gold has an energy level that corresponds to an energy residing near the middle of the bandgap characteristic of the semiconductor material (bandgap, of course, referring to the gap between the conductance band energy and the valance band energy of the semiconductor material). Such an energy level is typically referred to as deep bandgap impurity (as versus a shallow bandgap impurity that would have an energy level positioned relatively proximal to either the conductance band or the valance band energies). Further in this embodiment, the gold has a density within the relevant portions of the semiconductor material of approximately one time 10 to the 14 atoms/centimeter squared. Depending upon the application, this density could be increased by significant quantities if desired. The addition of the gold as an impurity increases the density of deep recombination traps in the semiconductor bandgap. The increased deep recombination traps density facilitates electrons-hole pair recombination that correspondingly reduces the carrier lifetime in the semiconductor. By increasing the recombination rate, an inversion layer will more readily form to prevent deep depletion failure mechanisms.

An appropriate dielectric material (102), such as an oxide layer deposited upon or grown upon the semiconductor layer, serves as the dielectric material for the resultant capacitor. A metallic layer (101), which metallic layer (101) is disposed on the dielectric layer (102), serves as the remaining electrode for the MOSCAP. An appropriate potential may then be applied to the semiconductor layer (103) and the metallic layer (101) in an appropriate application to cause the device to function as a capacitor.

Figure 2:
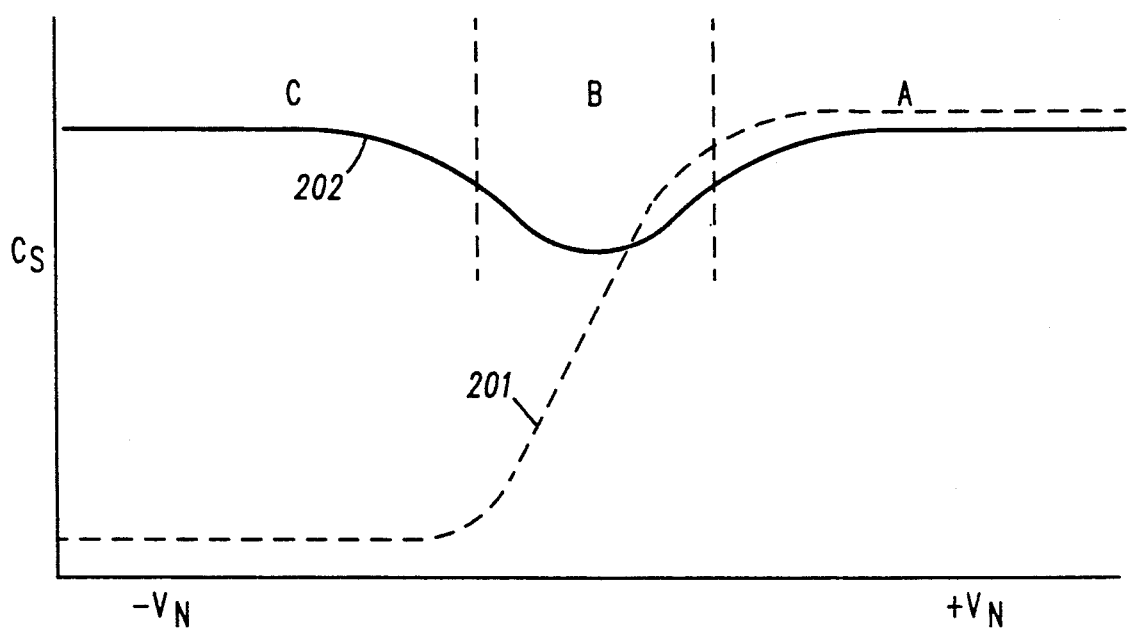
FIG. 2 comprises a graphic depiction comparing operation of a capacitor configured in accordance with the invention with a prior art MOSCAP.

With reference to FIG. 2, the capacitance of the semiconductor material ($C_s$) in a prior art MOSCAP is generally depicted by reference numeral (201). For high-frequency applications the device functions satisfactorily in an accumulation mode of operation (A), with capacitance dropping as reverse bias conditions develop and a depletion layer deepens (B). As reverse bias continues, the capacitance continues to drop, as frequently occurs in high-frequency applications, and operation of the prior art MOSCAP becomes unacceptable.

The MOSCAP disclosed herein and described above, with reference to FIG. 1, will function in a similar manner in an accumulation mode of operation (A), as the prior art MOSCAP. Similarly, as the bias reverses, a depletion region will begin to form, and reduce the capacitance somewhat (B). Due to the plurality of recombination traps provided by the gold impurity, however, an inversion layer will form (C) and the capacitance will return to nominal levels. As a result, although the capacitance of the semiconductor material will change somewhat, the total capacitance of the device will remain within acceptable limits even during high frequency, reverse bias operating conditions.

What is claimed is:

1. A capacitor comprising:
   A) a semiconductor layer having a characteristic band-gap, and further including at least one preselected impurity, which impurity has an energy level corresponding to an energy residing near the middle of the band-gap;
   B) a conductor layer; and
   C) a dielectric layer disposed between the semiconductor layer and the conductor layer; such that the capacitor will exhibit a substantially stable capacitance when used in a high frequency application.

2. The capacitor of claim 1, wherein the impurity comprises gold.

3. The capacitor of claim 1, wherein the impurity has a density within at least a part of the semiconductor layer on the order of at least $1 \times 10^{14}$ atoms/cm².

4. A capacitor comprising:
   A) a semiconductor layer having a characteristic band-gap, and further including at least one preselected impurity, which impurity is present within the semiconductor layer in a quantity sufficient to support formation of an inversion layer in the semiconductor layer when the capacitor operates during reverse bias/high frequency conditions;
   B) a conductor layer; and
   C) a dielectric layer disposed between the semiconductor layer and the conductor layer; such that the capacitor will exhibit a substantially stable capacitance when used in a high frequency application.

5. The capacitor of claim 4 wherein the impurity has an energy level corresponding to an energy residing near the middle of the band-gap.

6. The capacitor of claim 4, wherein the impurity comprises gold.

7. The capacitor of claim 4, wherein the impurity has a density within at least a part of the semiconductor layer on the order of at least $1 \times 10^{14}$ atoms/cm².

8. A method of forming a capacitor, comprising the steps of:
   A) providing a semiconductor material having a characteristic band-gap;
   B) incorporating at least one preselected impurity into the semiconductor material, which impurity has an energy level corresponding to an energy residing near the middle of the band-gap;
   C) disposing a dielectric layer proximal to the semiconductor material;
   D) disposing a conductive layer on the dielectric layer.

9. The method of claim 8, wherein the step of incorporating the impurity includes providing the impurity in a quantity sufficient to provide a density within at least a part of the semiconductor material on the order of at least $1 \times 10^{14}$ atoms/cm².

* * * * *